United States Patent [19]

Walsh et al.

[11] 4,454,835

[45] Jun. 19, 1984

[54] INTERNAL PHOTOLYSIS REACTOR

[75] Inventors: Peter J. Walsh, Sterling, N.Y.;
Nicholas Bottka, Springfield, Va.

[73] Assignee: The United States of America as represented by the Secretary of the Navy, Washington, D.C.

[21] Appl. No.: 417,272

[22] Filed: Sep. 13, 1982

[51] Int. Cl.³ .............................................. C23C 13/08
[52] U.S. Cl. ..................................... 118/712; 118/719; 118/723; 118/50.1
[58] Field of Search ...................... 118/50.1, 719, 723, 118/688, 689, 712; 427/54.1, 38, 39

[56] References Cited

U.S. PATENT DOCUMENTS

| | | | |
|---|---|---|---|
| 4,066,037 | 1/1978 | Jacob | 118/725 |
| 4,161,418 | 7/1979 | Morimoto et al. | 148/175 |
| 4,183,780 | 1/1980 | McKenna et al. | 156/643 |
| 4,223,048 | 9/1980 | Engle, Jr. | 427/39 |
| 4,226,897 | 10/1980 | Coleman | 427/39 |
| 4,226,898 | 10/1980 | Ovshinsky et al. | 427/39 |
| 4,262,631 | 4/1981 | Kubacki | 118/723 |

*Primary Examiner*—Evan K. Lawrence
*Attorney, Agent, or Firm*—R. F. Beers; W. Thom Skeer; Kenneth G. Pritchard

[57] ABSTRACT

A method and apparatus which permits photolysis of compounds without use of windows to permit unlimited growth of epitaxial layers. Epitaxial layers can include growth of crystals such as iron. A two section reactor chamber with a common opening between the sections is used for the internal production of high energy ultraviolet light to carry out the photolysis. The first section of the reactor chamber containing the substrate to be coated is connected to a source of molecular compound vapor capable of undergoing a photolytic change. A feed system provides a rare gas flow through the second section at low pressure past an electrode discharge system to produce ultraviolet light. The ultraviolet light passes through the opening between the sections and interacts with the molecular compound causing photolytic decomposition of the molecular compound and deposition of the desired epitaxial layer on the substrate. Upon exiting the reactor chamber, the molecular compound used for the photolysis is recaptured via a cold trap while a residual gas analyzer permits the exhaust cycle in the reactor chamber to either be vented or recycled depending on the level of purity of the rare gas.

5 Claims, 4 Drawing Figures

INTERNAL PHOTOLYSIS REACTOR

BACKGROUND OF THE INVENTION

1. Field of the Invention

This invention pertains to methods of growing thin film layers. In particular, this invention pertains to growing layers of molecules using photolysis to deposit materials such as iron, silver, and compounds available through interaction of molecular compounds with ultraviolet light. Specifically, the present invention is for an apparatus using photolysis that does not require windows and can be used to produce sustained photolytic reactions.

2. Description of the Prior Art

An important technique for the control deposition of thin films of metal, semiconductors, or insulators is the decomposition of compounds containing the desired molecule. This decomposition must occur at or near a suitable substrate in a controlled atmosphere. Examples of the desired molecule are Ag, ZnS, and $TiO_2$ for a metal, semiconductor, or insulator. The compounds containing the molecules should be relatively stable so they can be handled easily. Inorganic compounds containing the desired molecule have often been used as the deposition vehicle. It is desirable to have the compound and the vapor or gaseous phase so that it can be manipulated easily within pressure, flow, or vacuum systems.

Previous deposition techniques include sputtering, evaporation, molecular beam deposition, and chemical vapor deposition. Chemical vapor deposition involves a chemical reaction among gases to initiate decomposition. Pyrolysis is a common deposition technique in which the heated substrate decomposes the target molecule to be deposited. All the common techniques mentioned, sputtering, evaporation, molecular beam deposition, chemical vapor deposition and pyrolysis require or produce high temperatures in their application. The high temperature produces outgassing of stray or unwanted gases from the walls and components or the deposition chamber and often diffusion of chemical species from the substrate. These gases contaminate the deposited film.

The decomposition of the molecule containing compound can also be accomplished by photolysis. Photolysis uses light to initiate the decomposition. The energy absorbed from the light is sufficient to cause decomposition. Photolysis can be carried out at low temperatures. It thus offers a unique technique for depositing extremely clean films of the desired molecule on a given substrate.

Photolysis has previously been accomplished by irradiating the compound with light of sufficient energy to break apart the stable bonds attaching the molecule to the compound. This normally demands ultraviolet light and in compounds containing several bonds to the desired molecule there is a reasonable assumption that very high energy, vacuum ultraviolet light is required. Vacuum ultraviolet light will not pass through commonly available window materials, nor through the ambient atmosphere. These materials either absorb or are not transparent at the appropriate energy levels needed for ultraviolet light. Rather an evacuated path must be used to transmit the highest energy ultraviolet region which is of interest. Even if the ultraviolet light is transmitted through a special window material, deposition of the decomposed compound gas or vapor within the chamber rapidly coats the window material preventing subsequent passage of the ultraviolet light.

It is obvious that there is a need for an apparatus to carry out a method of photolysis of flowing or cyclically deposited compounds which can use highest energy ultraviolet. It is further desired that there be a photolysis apparatus which does not provide contamination by the internal production of substantial quantities of high energy ultraviolet light. Furthermore, to avoid outgassing contamination, it is desired to have on apparatus which permits the use of high energy ultraviolet within a cool, low pressure system.

SUMMARY OF THE INVENTION

The apparatus of the invention includes a two section reactor chamber used for the internal production of high energy ultraviolet light. The first section of the reactor chamber has a sample holder for holding a substrate to be coated. The second section has an electrode discharge system which has a set voltage drop across the electrodes. A feed system provides rare gas flow through the second section at low pressure, between several millitorr to several tens of millitorr. A molecular compound feed system either fills the first section with molecular compound as a static condition or is flowed through the second section. Although an opening is present between the two sections, laminar flow of the rare gas limits mixing of the contents of the two sections. The electric discharge current in the first section may be tens of milliamps up to several amperes depending on pressure, flow rate the geometry. Direct current, alternating current or high frequency excitation may be used. The flow or rare gas avoids any substantial temperature rise.

The substrate in the first section is either subjected to a molecular compound vapor flow over its surface or has been given time in the static situation for compound to adhere to its surface. For the latter case, the molecular compound in the first section is evacuated prior to the discharge current occurring in the second section. The mixing between two laminar flows over small distances is very low. Rare gases are extremely inert and produce minimal contamination of the film to be produced. The laminar flow of the rare gas in section two permits ultraviolet light produced by the electric discharge to travel through the opening between the sections, through a buffering layer of rare gas, if present, or through the flowing molecular compound if present, and deposit the desired film on the substrate through the photolysis of the molecular compound.

A vacuum pump system is attached to the reactor chamber to provide a smooth flow. Further modifications permit a complete recycling system to be built around the vacuum pump. Such a system will include a residual gas analyzer in a cold trap. The cold trap captures molecular compound as it leaves the reactor chamber so that it can be reused. The residual gas analyzer permits the rare gas exiting the reactor chamber to be monitored for purity and, provided that the level of impurities is beneath the preset level, for the rare gas to be recycled so that once again it provides the laminar flow within the reactor chamber.

Accordingly, it is an object of the present invention to produce a method and apparatus for photolysis of flowing or cyclic deposited compounds by the use of non-contaminating internal production of high energy ultraviolet light. It is a further object of the present invention to provide a cool, temperature controlled low pressure system that limits contamination due to outgassing.

DESCRIPTION OF THE PREFERRED EMBODIMENT

Table 1 lists the ionization potentials, the excitation energy of the lowest strong resident lines of the rare gases and the corresponding wavelengths along with similar information for mercury, cadmium, and thallium, Hg, Cd, and Tl respectively, which are three common sources of low energy ultraviolet. The rare gas emits deep ultraviolet radiation whose energies range from 8.44 electron volts in xenon to 21.1 electron volts in helium. This ultraviolet will not pass through common materials used as windows. The ionization potential, excitation potential of the singlet, $^1P$, and corresponding singlet radiation wavelength of five rare gases shows the relative selectivity of producing ultraviolet radiation by a discharge system within the rare gas.

TABLE I

| Rare Gas | Ionization Potential (ev) | Excitation Potential (ev) | Wavelength (nm) |
|---|---|---|---|
| He | 24.6 | 21.1 | 58.4 |
| Ne | 21.6 | 16.8 | 73.6 |
| Ar | 15.8 | 11.8 | 104.9 |
| Kr | 14.0 | 10.0 | 116.5 |
| Xe | 12.12 | 8.44 | 129.6 |
| Hg | 10.4 | 6.7 | 184.9 |
| Cd | 9.0 | 5.29 | 228.8 |
| Tl | 6.1 | 3.29 | 377.6 |

For rapid production of a large area of thin film by photolysis, it is desirable to have a flow of the molecule containing compound past the substrate to be coated. However, for precisely controlled build-up of an epitaxial film, the film may be deposited by photolysis of a sequence of thin films of the compound, one to a number of monolayers thick, which have been absorbed on the substrate. Epitaxy is a method of growing a thin layer of material upon a single crystal substrate so that the lattice structure is identical to that of the substrate. The technique is extensively used in the manufacture of semiconductors when a layer, known as the epitaxial layer, of different conductivity is required on the substrate. The substrate may be cooled if necessary, exposure of the substrate to the compound, gas or vapor, is allowed and the compound pumped out of the chamber and the photolysis of the absorbed compound is carried out. This produces a very thin layer of the molecule, perhaps less than a monolayer thick, since the molecule is smaller than the compound containing it. The repeated cyclic reintroduction of the compound gas or vapor into the chamber, its absorption and photolysis, allows the build-up of molecular film to a desired thickness.

Figure 1:
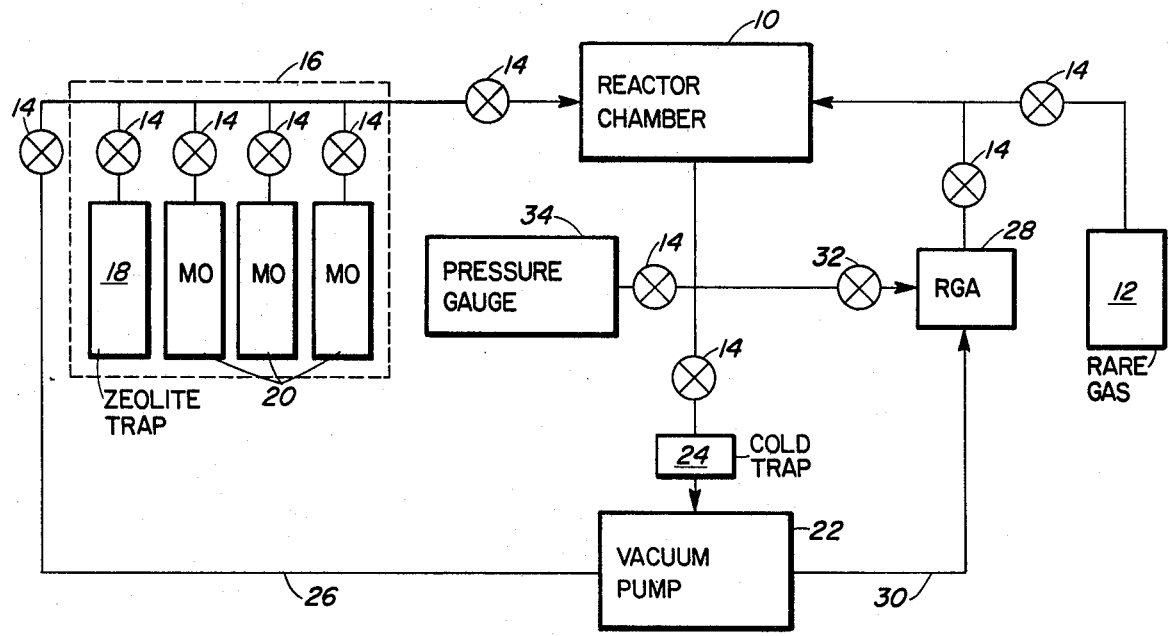
FIG. 1 is a block diagram of the present invention.

FIG. 1 represents a continuous flow for long growth system of crystal epitaxial layers. For purposes of example, the phrase epitaxial layer will include growing layers of iron and similar metals by means of photolytic deposit. The rare gas or rare gas mixture is introduced into reaction chamber 10 from a rare gas supply 12 which is monitored by a valve 14. Molecular compound is fed into reactor chamber 10 via molecular compound manifold 16 which may include a zeolite trap. Zeolites are a class of natural or synthetic compounds which are used as selective absorbers for separating mixtures of liquids and gases. Also connected to reactor chamber 10 is a vacuum pump 22 which assures the desired fluid flow of gases and vapors within reactor chamber 10. A cold trap 24 is placed between reactor chamber 10 and vacuum pump 22 to capture molecular compound which exits reactor chamber 10. As an alternative, molecular compound can be fed through vacuum pump 22 back to molecular compound manifold 16 via line 26. For such operations, zeolite trap 18 becomes significant when removing impurities from the molecular compound and further reduces the need for storage bottles 20 in molecular compound. The recycling of the molecular compound permits longer operations with seemingly larger growth rates possible. Also connected to vacuum pump 22 is a residual gas analyzer 28 via line 30 which permits the degree of impurities in rare gas exiting reactor chamber 10 to be determined. A needle valve 32 provides limited access for analysis, whether it be spectroscopic or otherwise, and also permits access to pressure gauge 34, which can be connected directly to reactor chamber 10 or via residual gas analyzer 28. Residual gas analyzer 28 can also be connected back to reactor chamber 10 to provide recycling of rare gas in a manner similar to that of molecular compound.

Figure 2:
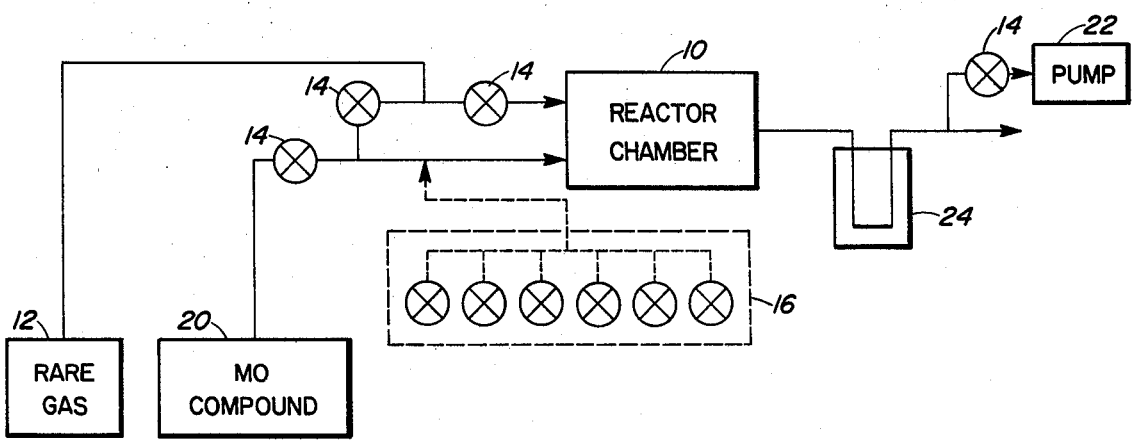
FIG. 2 is an alternate block diagram of the present invention.

In the flow system illustrated in FIG. 1, the rare gas or rare gas mixture will stream in a region enclosing the compound flow tube. An alternate block diagram of the flow system to the reactor chamber is shown in FIG. 2, where like components are referred by like numbers. In FIG. 2, closed cycle systems are not shown complete, but can be connected in the manner shown in FIG. 1.

Figure 3:
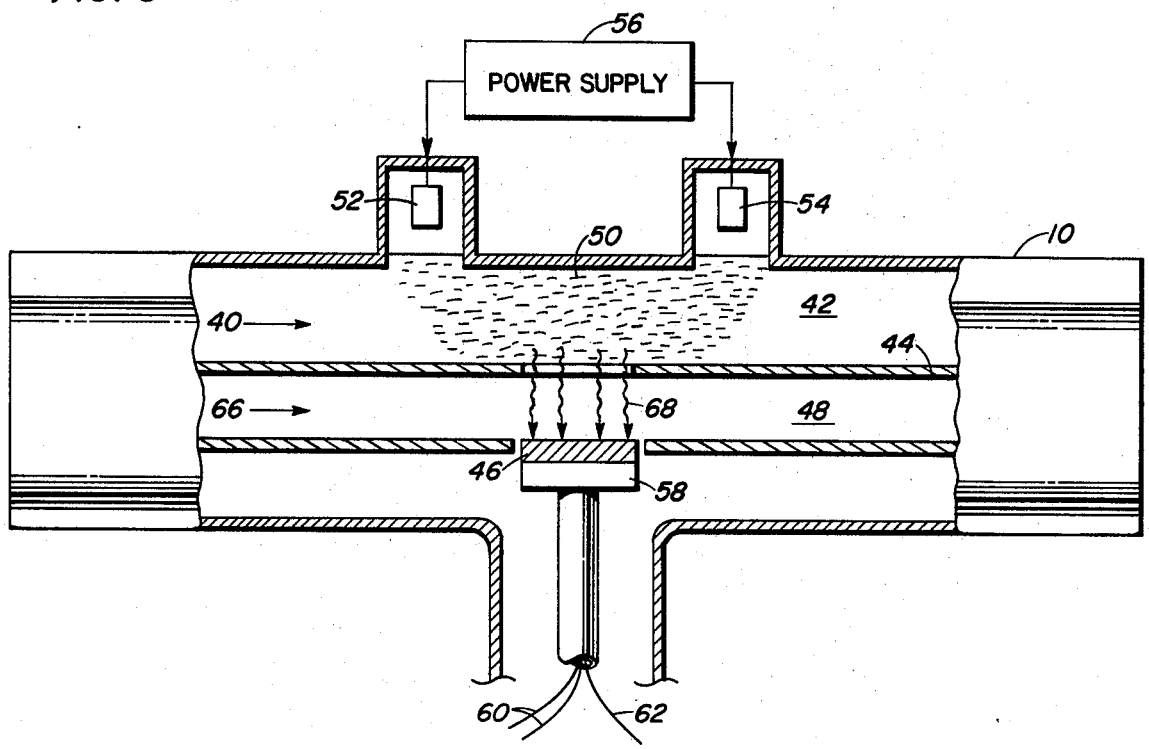
FIG. 3 is a cross-sectional view of the reactor chamber of the present invention.
Figure 4:
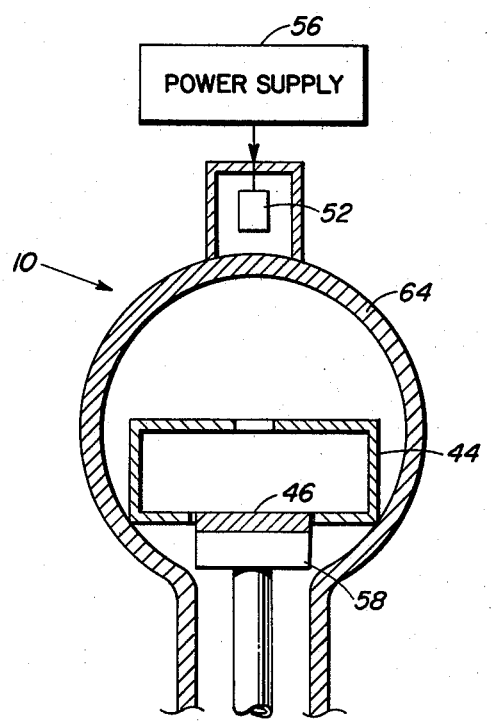
FIG. 4 is a cross-sectional view of the reactor chamber from a different perspective.

FIG. 3 is a cross-sectional view of reactor chamber 10 in one embodiment. Rare gas 40 streams in a region 42 enclosing a compound flow tube 44. Compound flow tube 44 will carry molecular compound vapor, possibly diluted with rare gas or rare gas mixture. The flow is designed to be a laminar flow across substrate 46. In the substrate region 48, perforations may be used in compound flow tube 44 to allow deep ultraviolet from rare gas 40 to enter compound flow tube 44. As shown in FIG. 3 and FIG. 4, a single opening may be used to permit light to travel between the two sections of reactor chamber 10. Rare gas 40 is excited in the discharge region 50 between electrodes 52 and 54 which are maintained at a preset voltage potential by power supply 56. Substrate 46 may be placed on a demountable sample holder 58 which may be either heated or cooled to a preset temperature via thermal control leads 60. A thermometer to monitor the sample substrate can be provided by a thermo/couple, not shown. The temperature of sample holder 58 can be monitored by this thermo/couple.

FIG. 4 shows a cross-sectional end view of reactor chamber 10. In this view, reactor chamber 10 is shown to be made up of a discharge gas glass tube 64 which has within it compound vapor tube 44. Compound vapor tube 44 fits over sample substrate 46 and sample holder 58.

As shown in FIG. 3, rare gas 40 and molecular compound vapor 66 have individual path areas for their laminar flow. The present invention will work with either both a rare gas and molecular compound vapor flowing or with first one flowing and then the other. In the both flow situation, rare gas 40 undergoes discharge in region 50 which permits ultraviolet light 68 to pass unfiltered into compound flow region 48, where it interacts with the molecular compound vapor 66. The light has sufficient energy to break apart the stable bonds attaching the molecule to the compound. The desired compound liberated by the decomposition caused by this photolysis is directly decomposed onto sample substrate 46. Because it will be adding to sample substrate 46 molecule by molecule, the crystal growth and the lattice matching will be of very high quality.

For the individual flow, rare gas 40 is withheld while molecular compound vapor 66 is permitted to flow through compound vapor tube 44. The molecular compound coats substrate 46. The vacuum system shown previously is then used to evacuate flow region 48 leaving only molecular compound that coats substrate 46. Rare gas 40 is now permitted to flow by electrodes 52 and 54. When the preset voltage potential is applied to electrodes 52 and 54, discharge occurs in region 50 which permits ultraviolet light of desired spectrum region. This light passes directly into flow region 48 as shown, and causes molecular compound on substrate 46 to undergo decomposition. Once again, the vacuum pump system empties the chamber upon the appropriate length of time necessary for molecular compound on substrate 46 to undergo photolysis. The cycle can then be repeated as often as necessary to build up the desired molecule structure on substrate 46 to the depth desired.

Commonly, the compound is trapped in cold trap 24 or filtered through a zeolite trap 18 as described previously. When a cold trap is used, such as cold trap 24, it must be sufficiently cold to condense the compound gas or vapor but not cold enough to condense the rare gas used.

SAMPLE

An iron film was deposited by the ultraviolet photolysis with pentacarbonyl, $Fe(CO)_5$, with a 254 nm line of an external mercury light. Substrates were maintained at room temperature and also at dry ice-acetone temperature, $-80°$ C. Both cases permitted growth of iron.

Internally produced ultraviolet photolysis deposition methods described above are particularly useful in the photo decomposition of organo-metallic compounds. Some of these compounds, such as $(CH_3)_3Al$, $(CH_3)_3Ga$, $(CH_3)_2Cd$, are being used in metallo-organic chemical vapor deposition systems to synthesize metals and semiconductors by pyrolysis. Pyrolysis is the chemical decomposition of compounds by application of high temperatures. The admixture of the proper metallo-organic compounds in an internally produced photolysis reactor allows the deposition of metals, semiconductors or insulators at much lower temperatures. Low temperature deposition process is indispensable to the metallization and passivation of semiconductors such as HgCdTe which decompose readily at moderate temperatures because of the high vapor pressure of their constituents. Metallo-organic compounds containing column III-V or II-VI elements and oxide compounds, such as $ZnS$, $ZnSe$, $HgS$, $SiO_2$, $TiO_2$ have been synthesized in the laboratory. Their use in low temperature photolysis processes allows the synthesis of high and low index films of very high quality which are required for low absorption optical coatings. Under proper substrate surface conditions, such films not only adhere better, but they grow epitaxially upon the substrate for use in active semiconductor devices. In the cyclic deposition method, the deposition rate is very slow and controlled in a manner similar to that found in molecular beam epitaxy with the advantage of much higher surface area homogeneity at a much lower cost. The flow method allows high growth rates over large substrate surfaces areas.

In FIGS. 1 and 2, molecular compound manifold 16 is shown with molecular bottles 20. Each container 20 may contain different molecular compound permitting the sequence of epitaxial layers of different composition to be grown by merely replacing the desired molecular compound after the depth of an epitaxial layer of a given molecule is grown.

It is obvious to those skilled in the art that numerous modifications to the above can be made.

What is claimed is:

1. An apparatus for growing epitaxial layers by photolysis comprising:
    a reactor chamber divided into two sections, said sections having a common opening between them;
    a sample holder in the first of said two sections for holding a given substrate on which an epitaxial layer is to be grown;
    an electrode discharge system in said second section of said reactor chamber for producing predetermined voltage potential;
    means for supplying a rare gas to said second section of the reactor chamber, said rare gas emitting light of a desired spectrum range due to electrical discharge of said voltage potential through said rare gas;
    means for supplying a molecular compound vapor to said first section of the reactor chamber for coating said substrate on said sample holder with a given molecular compound that undergoes a photolytic change when exposed to said desired spectrum through said opening; and
    a recycle system connected to said reactor chamber for reusing said rare gas and said molecular compound.

2. An apparatus for growing epitaxial layers by photolysis as described in claim 1 where said recycle system comprises:
    a cold trap connected to said first section of said reactor chamber for capturing molecular compound exiting said first section;
    a vacuum pump connected to said reactor chamber via said cold trap for evacuating said reactor chamber;
    a residual gas analyzer connected to said vacuum pump and reactor chamber for determining the chemical composition of material exiting said reactor chamber; and
    a closed loop path connected between said vacuum pump and said rare gas for recycling said rare gas if said residual gas analyzer measures a preset level of rare gas.

3. An apparatus for growing epitaxial layers by photolysis as described in claim 1 where said first and second sections of said reactor chamber comprise respectively a molecular compound vapor glass tube within a discharge gas glass tube.

4. An apparatus for growing epitaxial layers by photolysis as described in claim 1 where said sample holder further comprises a thermal control section for maintaining said substrate in said sample holder at a predetermined temperature.

5. An apparatus for growing epitaxial layers by photolysis comprising:
   a reactor chamber with a molecular compound vapor glass tube within a discharge gas glass tube, said molecular compound vapor glass tube having an opening;
   a sample holder mounted in said molecular compound vapor glass tube for holding a given substrate on which an epitaxial layer is to be grown;
   a thermal control section connected to said sample holder for maintaining said substrate in said sample holder at a predetermined temperature;
   an electrode discharge system in said discharge gas glass tube for producing a predetermined voltage potential;
   means for supplying a rare gas to the discharge gas glass tube of said reactor chamber, said rare gas emitting light of a desired spectrum range due to electric discharge of said voltage potential through said rare gas;
   means for supplying a molecular compound vapor to said molecular compound vapor glass tube for coating said substrate on said sample holder with a given molecular compound that undergoes a photolytic change when exposed to said desired spectrum through said opening;
   a cold trap connected to said molecular compound vapor glass tube for capturing molecular compound as it exits said vapor glass tube;
   a vacuum pump connected to said reactor chamber via said cold trap for evacuating said reactor chamber;
   a residual gas analyzer connected to said vacuum pump and reactor chamber for determining the chemical composition of material exiting said reactor chamber; and
   a closed loop path connected between said vacuum pump and said means for supplying said rare gas for recycling said rare gas if said residual gas analyzer measures a preset level of rare gas.

* * * * *